United States Patent [19]

Youn et al.

[11] Patent Number: 5,243,555
[45] Date of Patent: Sep. 7, 1993

[54] MEMORY CELL FOR USE IN A STATIC RANDOM ACCESS MEMORY

[75] Inventors: Kwangjun Youn; Changseok Lee; Hyungmoo Park; Nakseon Seong, all of Daejeon, Rep. of Korea

[73] Assignee: Korea Electronics and Telecommunications Research Institute, Rep. of Korea

[21] Appl. No.: 740,957

[22] Filed: Aug. 6, 1991

[30] Foreign Application Priority Data

Aug. 6, 1990 [KR] Rep. of Korea ............... 90-12013

[51] Int. Cl.$^5$ ............................................. G11C 11/40
[52] U.S. Cl. ................................. 365/154; 365/156; 365/190
[58] Field of Search ............... 365/154, 188, 179, 190, 365/202, 158

[56] References Cited

U.S. PATENT DOCUMENTS

| | | | |
|---|---|---|---|
| 4,128,773 | 12/1978 | Troutman et al. | 365/156 X |
| 4,404,657 | 9/1983 | Furuyama et al. | 365/154 |
| 4,575,821 | 3/1986 | Eden et al. | 365/154 |
| 4,782,467 | 11/1988 | Belt et al. | 365/154 |
| 4,995,000 | 2/1991 | Terrell | 365/154 |

FOREIGN PATENT DOCUMENTS

0004743 1/1980 Japan .

Primary Examiner—Eugene R. LaRoche
Assistant Examiner—Son Dinh
Attorney, Agent, or Firm—Evenson, McKeown, Edwards & Lenahan

[57] ABSTRACT

A memory cell for use in a SRAM improving the operating characteristics and capable of high density is described. In the its construction, the data is stored to a cell latch which includes load resistances and driving FETs, and a transmission FET is turned "ON" in case that a word line is selected and simultaneously electrically connects a bit line with the cell latch. A reading FET transmits the memorized contents of the cell latch to the transmission FET during reading operation of the memory cell and a writing FET stores the data of the bit line into the cell latch during writing operation of the memory cell. Thus, the predominant operating characteristics with respect to the threshold voltage variations among device parameters of FET can be obtained, and the breakdown phenomenon of the stored data can be prevented by separating the cell latch and the bit line in the memory cell.

5 Claims, 8 Drawing Sheets

MEMORY CELL FOR USE IN A STATIC RANDOM ACCESS MEMORY

FIELD OF THE INVENTION

The present invention relates to a memory cell for use in a static random access memory (SRAM), particularly such a memory cell allows the improvement of the operating characteristics and high density of a semiconductor device.

BACKGROUND OF THE INVENTION

Generally, a memory is a device storing data and becomes an indispensable device in a computer, etc. Recently, with a rapid progress in the computer technology, high efficient systems having the processing capability of high speed data has been manufactured. In these high efficient systems, it is already known fact that the memory device which predominates in the speed characteristic has come to be keenly required. For high speed memory device, the memory device of GaAs materials of the compound semiconductor has been widely used and the GaAs memory devices are superior to all Si memory devices manufactured up to now in speed characteristics.

However, the GaAs memory device has problems that it is behind the Si semiconductor in processing technology, the high density during manufacturing is difficult because the material itself has a complicated characteristics, namely, the parameter variations of a device and a product is high in price caused by deterioration of its yield.

Figure 1A:
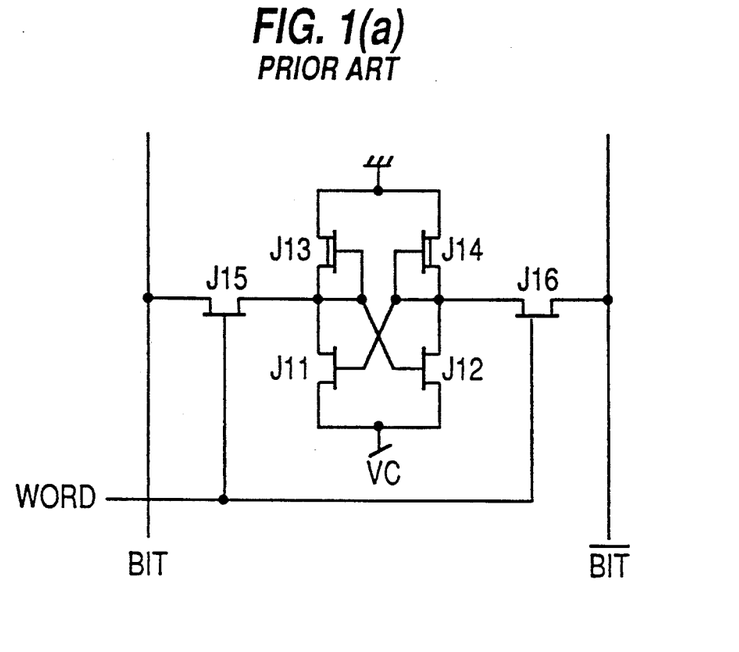
FIGS. 1A to 1E show circuit diagrams illustrating various construction of the prior art SRAM memory cell.

FIG. 1A shows a circuit diagram of the prior art GaAs SRAM memory cell using construction of a Si SRAM memory cell.

In FIG. 1A, the GaAs SRAM memory cell includes a cell latch which stores complemental data and consists of the symmetrical construction of two enhancement field effect transistors (FETs) J11 and J12 and two depletion FETs J13, and two transmission FETs J15 and J16 for transmitting the complemental data of the cell latch to bit lines BIT and $\overline{BIT}$, respectively.

Thus, the cell latch composed of bistable construction has a property that it becomes "1" or "0" which is a stable complemental logic data even if somewhat signal is applied. Also, the transmission FETs J15 and J16 are turned ON in case that corresponding work line is only selected, so that they can write data to the cell latch or read out data from the cell latch.

Figure 1B:
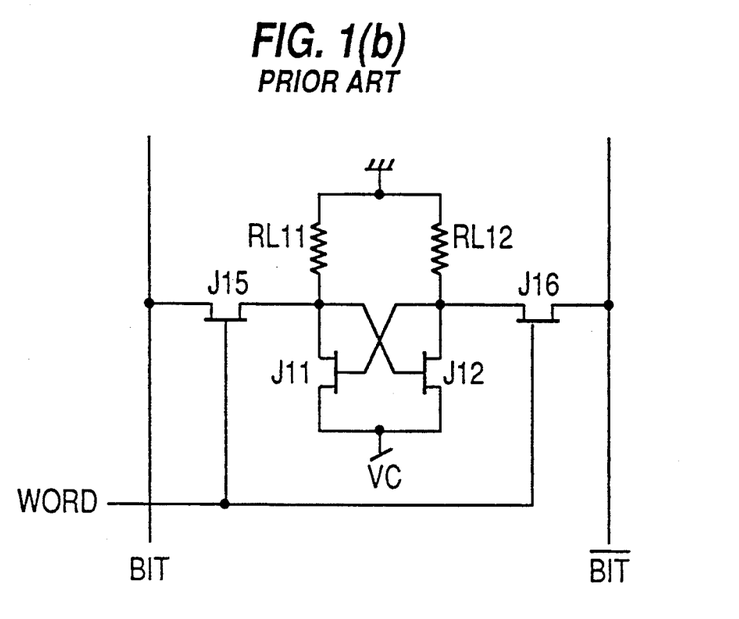

The memory cell shown in FIG. 1B is same construction as that of FIG. 1A except that the depletion FETs J13 and J14 are replaced with load resistances RL12 and RL13.

However, the above construction of the memory cell has disadvantages that the variation of the device parameters is small, while Si RAM is useful under the well established process condition, if the variation of the device parameters becomes large, the cell operation becomes unstable caused by the small variation of the device parameters, and in case that the memory cell caused by the unstable operation is selected, the data having been stored in broken (for example, the change from the state of "0" to "1" or the change from the state of "1" to "0").

Figure 1C:
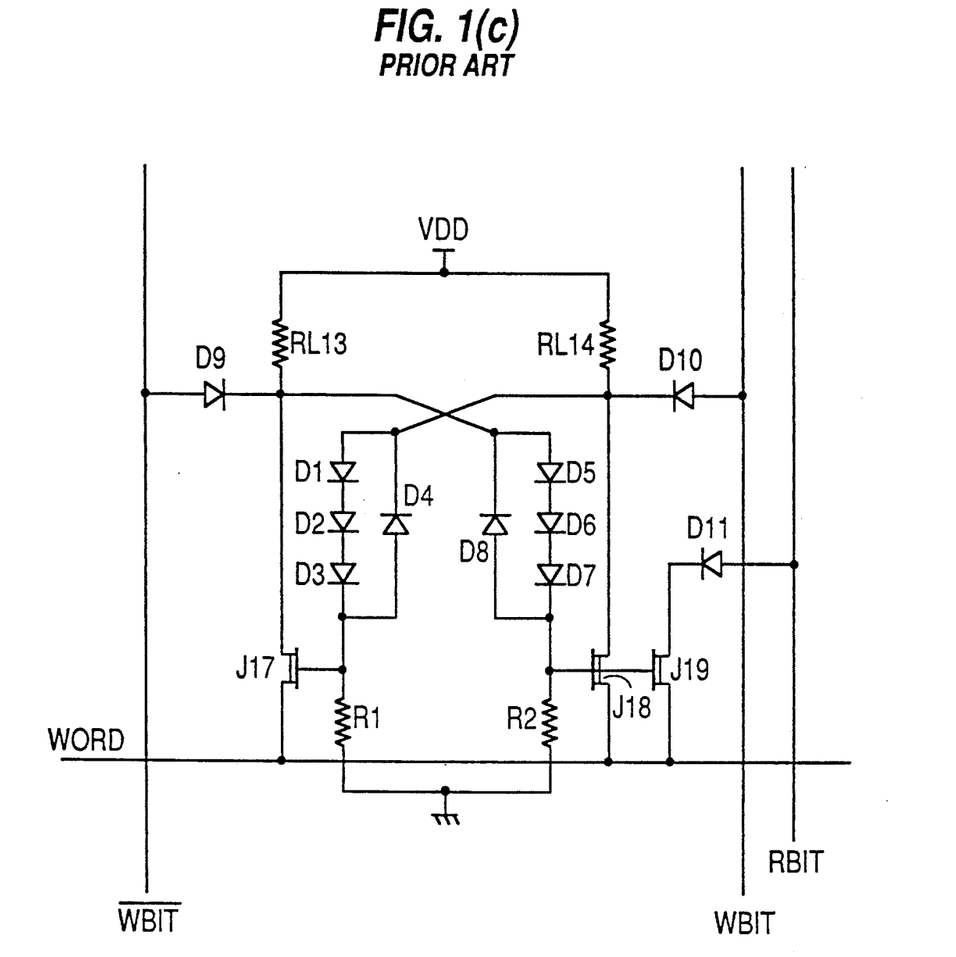

FIG. 1C shows circuit diagram illustrating another prior art memory cell which consists of depletion FETs since the manufacture of the enhancement FET may be impossible technically.

In FIG. 1C, the cell latch of the memory includes load resistance RL13 and RL14, driving depletion FETs J17 and J18, diodes D1, D2, D3, D4, D5, D6, D7 and D8 for regulating bias voltage of the depleation FETs J17 and J18 and resistances R1 and R2. Also, write bit lines WBIT and $\overline{WBIT}$ for writing data to the cell latch are connected to the cell latch through diodes D9 and D10, respectively and a read bit line RBIT for reading out the data from the cell latch is connected to a driving depletion FET J18 through a diode D11 and a reading FET J19.

The memory cell having above construction is disclosed in U.S. Pat. No. 4,575,821 (issued Mar. 11, 1986).

However, since these construction comprises only depletion FETs, its use is difficult in the advanced technology using enhanced FETs together with depletion FETs, its power consumption is high and the driving of a sense amplifier is difficult.

Figure 1D:
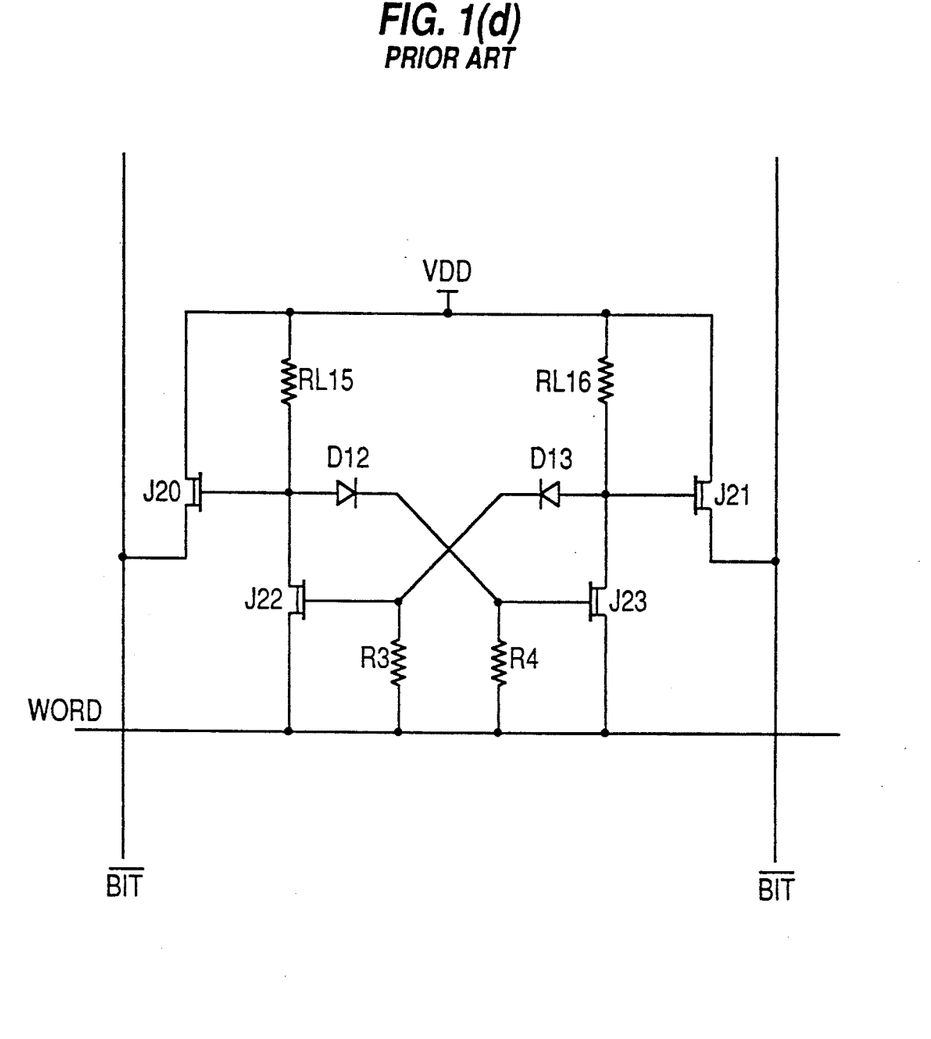

FIG. 1D shows circuit diagram of still another prior art memory cell composed of depletion FETs.

As shown in FIG. 1D, the cell latch of the memory cell includes load resistances RL15 and RL16, drining depletion FETs J22 and J23, diodes D12 and D13 for regulating bias voltage of the depletion FETs and load resistances R3 and R4. And, bit lines BIT and $\overline{BIT}$ are connected to the cell latch through FETs J20 and J21 for reading out data from the cell latch.

Thus, the technology which can improve operatin characteristic by excluding the influence of bit lines BIT and $\overline{BIT}$ from the cell latch is disclosed in U.S. Pat. No. 4,981,807 and Japan, Pat. No. 63-160087.

These memory cell, however, doesn't work well in a writing operation because the cell latch consists of only depletion FETs excluding another FETs.

Figure 1E:
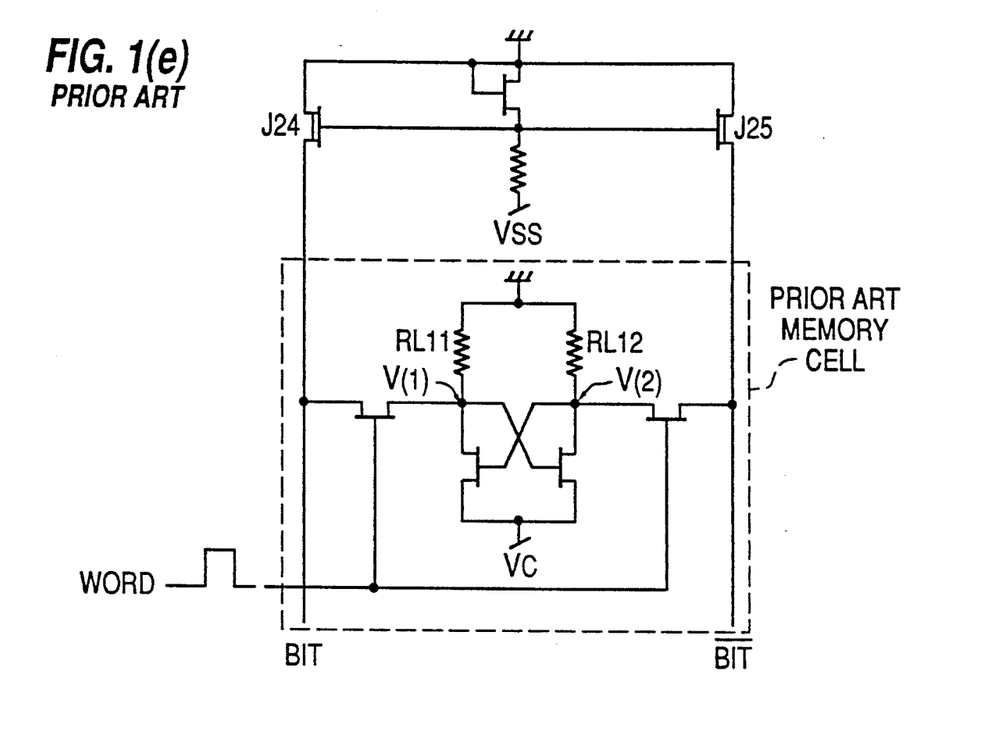

FIG. 1E shows circuit diagram illustrating still another prior art memory cell.

Referring to FIG. 1E, power source Vss is applied to bit lines BIT and $\overline{BIT}$ through FETs J24 and J25 respectively connected thereto. Moreover, the cell latch as shown in FIG. 1B is connected to the bit lines BIT and $\overline{BIT}$ and word line WORD. In this construction, when selecting the work line WORD, i.e., a cell selecting signal is applied to the word line WORD, the cell latch among the rising edge f pulse of the word line WORD must transmit the data to the bit line BIT while maintaining the before selecting data as it is.

Figure 1F:
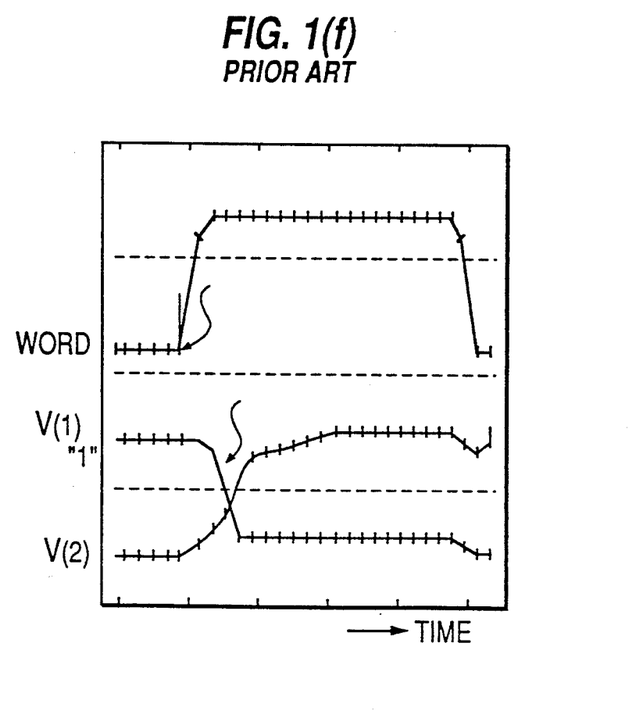
FIG. 1F shows a chart illustrating the breakdown of the stored data during reading operation of the prior art SRAM memory cell.

However, if the variation of the device parameters becomes large in the slightest degree, the data V(1) and V(2) is changed, thereby breaking the stored data as shown in FIG. 1F.

Thus, in case that the variation of the device parameters is excessive as GaAs memory, the breakdown of the data deteriorates a yield of the memory and makes the manufacturing of high integrated memory difficult.

SUMMARY OF THE INVENTION

It is therefore an object of the present invention to provide a memory cell for use in a static random access memory enlarging the operating range with respect to the variation of a device parameters and capable of high density.

In accordance with the present invention, the memory cell stores data in the cell latch composed of load resistances and driving FETs, and transmission FET is turned ON when a word line is selected and electrically connects a bit line with the cell latch. The reading FET transmits the memorized data of the cell latch to the transmission FET during reading operation of the memory cell and the writing FET stores the data of the bit line into the cell latch during writing operation of the memory cell.

BRIEF DESCRIPTION OF THE DRAWINGS

The above and other advantages of the present invention will become more apparent from the following detailed description taken with the accompanying drawing, in which.

DETAILED DESCRIPTION OF THE INVENTION

Figure 2:
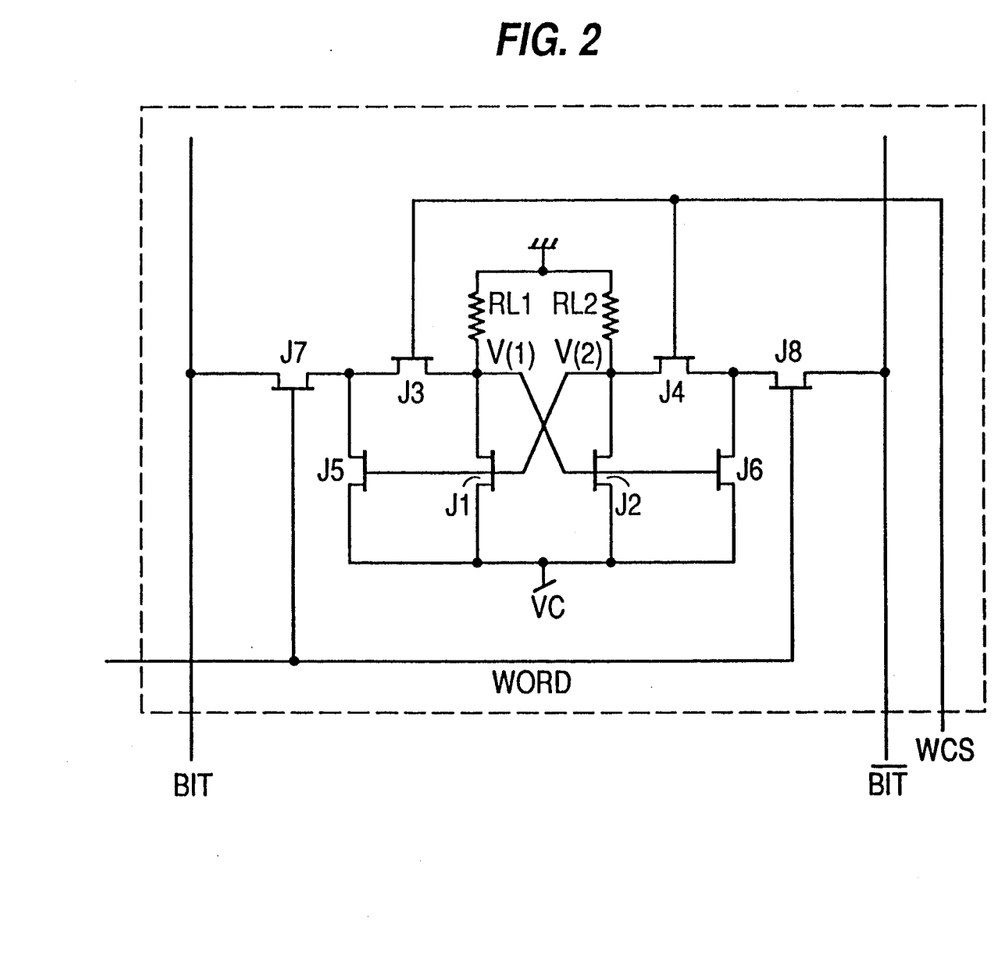
FIG. 2 shows a circuit diagram of the memory cell illustrating the preferred embodiment according to the present invention.

Referring to FIG. 2, the memory cell includes the cell latch composed of load resistances RL1 and RL2 and driving FETs J1 and J2. Respective gates of data writing FETs J3 and J4 are connected to a write control line WCS in common, with respective sources connected to the load resistances RL1 and RL2 of the cell latch respectively. Data reading FETs J5 and J6 are connected by their gates to the gates of the driving FETs J1 and J2 respectively, and by their sources to the power source Vc in common. Transmission FETs J7 and J8 have their drains connected to bit lines BIT and $\overline{BIT}$ respectively, their gates connected to a word line WORD in common and their sources connected to the drains of the data reading FETs J5 and J6 respectively and simultaneously the drains of the data writing FET J3 and J4 respectively.

A mechanism for reading the data from the memory cell having above described construction will be described.

While corresponding word line WORD is selected and a signal level applied to the word line WORD is raised up to a value which can conduct the transmission FETs J7 and J8, thereby starting the operation of the memory cell.

If the transmission FETs J7 and J8 are conducted, the data reading FETs J5 and J6 are turned on/off by respective input of the logic states V(1) and V(2) of the data in the cell latch. At this time, the logic states $\overline{V(1)}$ and V(2) are transmitted to the bit lines BIT and $\overline{BIT}$ through the transmission FETs J7 and J8 respectively. Thus, when reading out the data from the memory cell, the write control line WCS has a low voltage level which turns the writing FETs J3 and J4 off.

Next, a mechanism for writing the data into the memory cell will be described.

The write control line WCS turns the data writing FETs J3 and J4 on, the word line WORD is selected, and then, the transmission FETs J7 and J8 are turned on, thereby starting the writing operation. If the data writing FETs J3 and J4 and the transmission FETs J7 and J8 are turned on, since the logic states V(1) and V(2) of the cell latch become same logic states as those of the bit lines BIT and $\overline{BIT}$, the data provided through the bit line BIT come to store into the cell latch. While the write control line WCS has a low voltage level, if the data writing FETs J3 and J4 are turned off, they cut off the cell latch and the bit lines BIT and $\overline{BIT}$, and then, the logic states V(1) and V(2) of the data stored in the cell latch are maintained.

Thus, in the memory cell according to the present invention, since the cell latch storing the data and the bit lines are separated and the data writing FETs J3 and J4 drive electrical connection of the bit line with the cell latch, the breakdown phenomenon of the data occurring when the driving FETs J1 and J2 of the cell latch drive the bit line was removed.

The reason is that the bit lines BIT and $\overline{BIT}$ don't directly affect to the cell latch storing data. Moreover, since the cell latch only stores the data and does not drives the bit lines, the size of the cell latch can be relatively reduced compared with the conventional cell latch, thereby reducing the power consumption. Also, in accordance with the present invention, even if memory cell is increased in the number of device, it can be manufactured with a same or small area compared with the conventional memory cell because its size can be reduced. And, since data reading FETs J5 and J6 are excluded from the cell latch, the size of the cell latch can be reduced and since the driving capability of the bit line can be raised by enlarging the data reading FETs J5 and J6, the speed characteristics can be improved.

Figure 3:
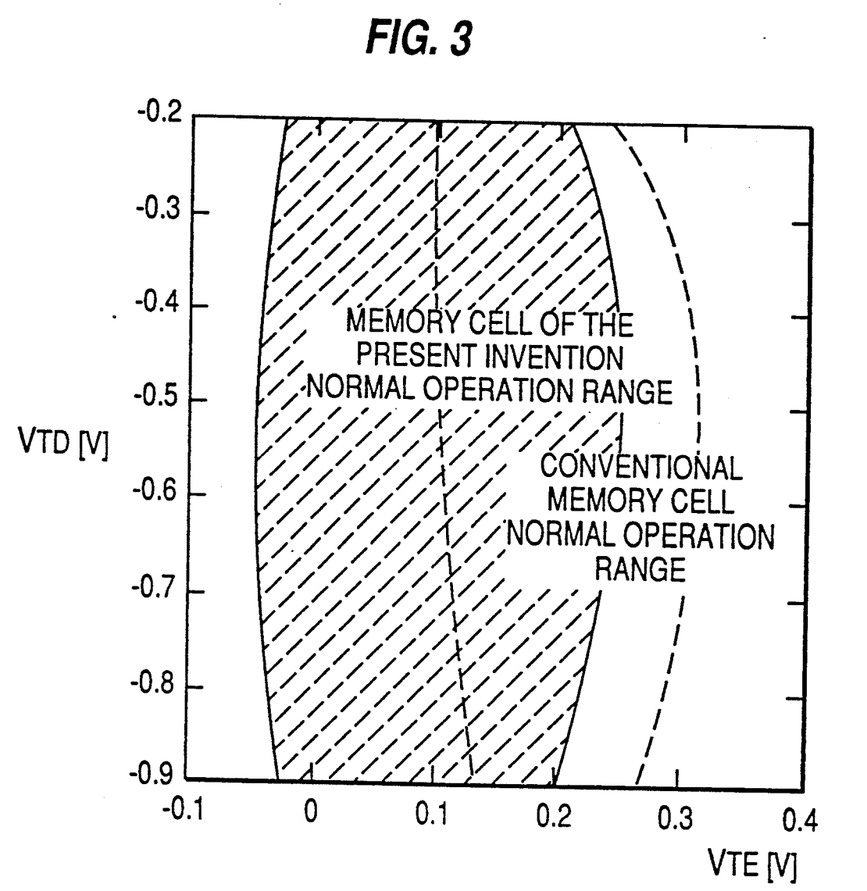
FIG. 3 shows a chart illustrating a normal operation range as a function of threshold voltage variation during the operation of the memory cell of the present invention and the prior art.

FIG. 3 shows a chart illustrating a normal operation range as a function of threshold voltage variation to compare the memory cell of the present invention with the conventional memory cell.

To make the same size with the memory cell of the present invention, in FIG. 1B, the conventional memory cell uses the load resistances RL11 and RL12 of 100 kΩ, a size of 15 μm for the driving resistances RL11 and RL12 of 100 kΩ, a size of 15 μm for the driving FETs J11 and J12 and a size of 10 μm for the transmission FETs J15 and J16. And the memory cell by this invention uses the load resistances RL1 and RL2 of 100 kΩ, a size of 2 μm for the driving FETs J1 and J2 and the data writing FETs J3 and J4 and a size of 10 μm for the reading FETs J5 and J6 and the transmission FETs J7 and J8. And the threshold voltage variation of ±50 mV is simulated between neighboring devices.

As a result, if the threshold voltage of the depletion FET $V_{TD}$ is −0.5 V, the conventional memory cell is operated when the threshold voltage of the enhancement FET $V_{TE}$ is within the range of 0.1 V to 0.3 V and the memory cell by this invention is operated when it is within the range of −0.05 V to 0.25 V. Therefore, it will be appreciated that the memory cell by this invention is operated at the range of the wide threshold voltage. Since the threshold voltage among the device parameters of the FET is a parameter determining the operation of the circuit, what is strong to the threshold voltage variation is wide in the operation range of the circuit.

Figure 4:
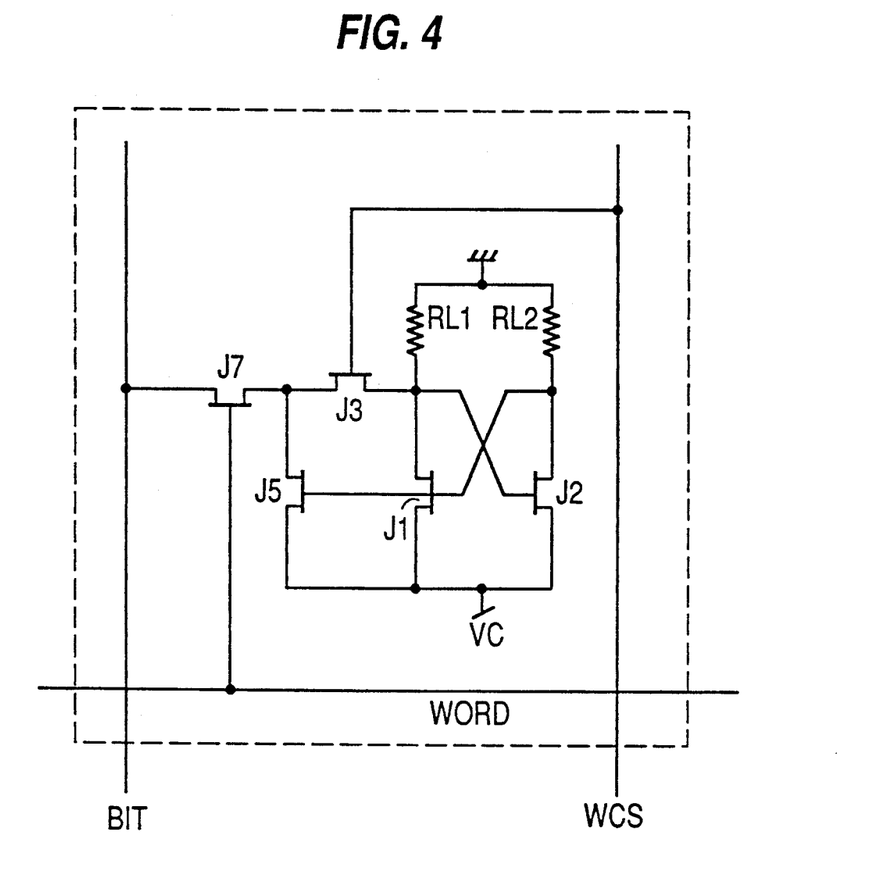
FIG. 4 shows a circuit diagram of the memory cell illustrating another embodiment according to the present invention.

FIG. 4 shows a circuit diagram of the memory cell illustrating another embodiment according to the present invention. This differs in that the bit line $\overline{\text{BIT}}$ and the data reading FET J6, the transmission FET J8 and the data writing FET J4 connected thereto are omitted from FIG. 2. However, in this case, it can obtain the same effect as described above.

Figure 5:
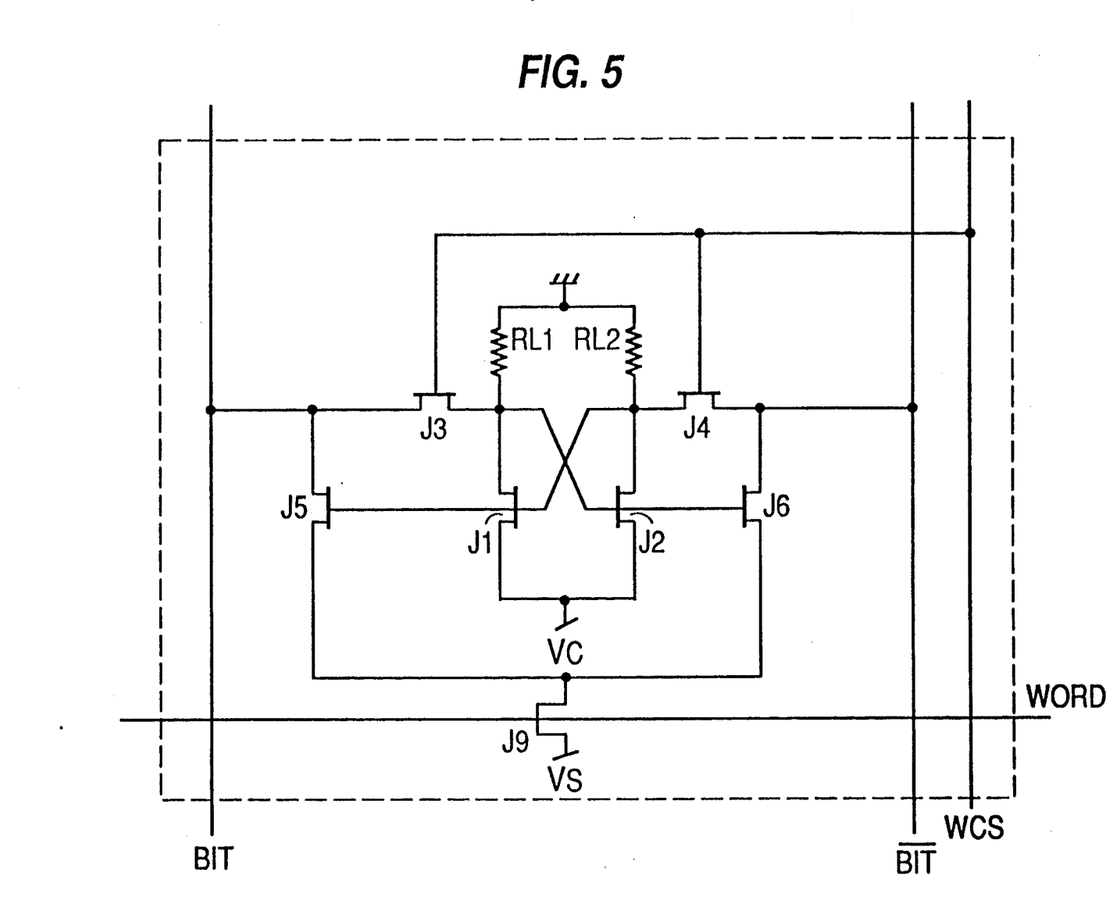
FIG. 5 shows a circuit diagram of the memory cell illustrating still another embodiment according to the present invention.

FIG. 5 shows a circuit diagram of the memory cell illustrating still another embodiment according to the present invention. This differs in that two transmission FETs J7 and J8 connected to the word line WORD are omitted and respective sources of the data reading FETs J5 and J6 are connected to the drain of word line driving FET J9, the WORD, with the source connected to power source Vs.

Therefore, in accordance with the present invention, the bit lines and the cell latch are separated by the data writing FETs J5 and J6 to improve the operation range, and reduce the power consumption by reducing the size of the cell latch. Moreover, with the use of GaAs SRAM which has large variation of the device parameters, high integrated SRAM is capable of manufacturing and the manufacturing yield of the memory cell can be greatly improved.

What is claimed is:

1. A memory cell for use in a static random access memory, said memory cell having a word line WORD and complementary bit lines BIT and $\overline{\text{BIT}}$, comprising:

a cell latch symmetrically connecting a first and second load means with a first and second enhancement FETs J1 and J2, and maintaining complemental data at a first connecting point between said first load means and said first enhancement FET J1 connected thereto serially and a second connecting point between said second load means and said second enhancement FET J2 connected thereto serially;

a write control line WCS to which control signal is provided when writing data into said cell latch;

transmission enhancement FETs J7 and J8 controlling the electrical connection of said respective bit lines BIT and $\overline{\text{BIT}}$ and respective a first and second transmission line by a signal applied to said word line WORD;

data writing enhancement FETs J3 and J4 for writing the data of said bit lines BIT and $\overline{\text{BIT}}$ into said cell latch by controlling the electrical connection of said first and second connecting point and said first and second transmission line by the signal applied to said write control line WCS; and, data reading enhancement FETs J5 and J6 for controlling the complemental data stored in said cell latch to said first and second connecting point in order to supply the complemental data to said bit lines BIT and $\overline{\text{BIT}}$ through said transmission enhancement FETs J7 and J8.

2. A memory cell for use in a static random access memory, said memory cell having a word line WORD and one bit line with respect to one cell comprising:

a cell latch symmetrically connecting a first and second load means with a first and second enhancement FETS J1 and J2, and maintaining the complemental data at a first connecting point between said first load means and said first enhancement FET J1 connected thereto serially and a second connecting point between said second load means and said second enhancement FET J2 connected thereto serially;

a write control line WCS to which control signal is provided when writing data into said cell latch;

transmission enhancement FET J7 controlling the electrical connection of said bit line BIT and a first transmission line by the signal applied to said word line WORD;

data writing enhancement FET J3 for writing the data of said bit line BIT into said cell latch by controlling the electrical connection of said first connecting point and said first transmission line by the signal applied to said write control line WCS; and, data reading enhance FET J5 for controlling transmission of the complemental data stored in said cell latch to said first transmission line by the signal applied to said first and second connecting point in order to supply the complemental data to said bit line BIT through said transmission enhancement FET J7.

3. A memory cell for use in a static random access memory, said memory cell having a word line WORD and complementary bit lines BIT and $\overline{\text{BIT}}$, comprising:

a cell latch symmetrically connecting a first and second load means with a first and second enhancement FETs J1 and J2, and maintaining the complemental data at a first connecting point between said first load means and said first enhancement FET J1 connected thereto serially and a second connecting point between said second load means and said second enhancement FET J2 connected thereto serially;

a write control line WCS to which control signal is provided when writing data into said cell latch;

data writing enhancement FETs J3 and J4 for writing the data of said bit lines BIT and $\overline{\text{BIT}}$ into said cell latch by controlling the electrical connection of said first and second connecting point and a first and a second transmission line by the signal applied to said write control line WCS;

data reading enhancement FETs J5 and J6 for controlling transmission of the complemental data stored in said cell latch to said first and second transmission line by the signal applied to said first and second connecting point in order to supply the complemental data to said bit lines BIT and $\overline{\text{BIT}}$; and, a word line driving FET J9 controlling the electrical connection of common connecting point of said data reading enhancement FETs J5 and J6 and power source Vs by the signal provided to said word line.

4. The memory cell as claimed in claim 1, wherein said respective load means is composed of depletion FET.

5. The memory cell as claimed in claim 1, wherein said respective load means is composed of load resistance.

* * * * *